United States Patent [19]

Roohparvar

[11] Patent Number: 5,526,364
[45] Date of Patent: Jun. 11, 1996

[54] APPARATUS FOR ENTERING AND EXECUTING TEST MODE OPERATIONS FOR MEMORY

[75] Inventor: Frankie F. Roohparvar, Cupertino, Calif.

[73] Assignee: Micron Quantum Devices, Inc., Boise, Id.

[21] Appl. No.: 386,704

[22] Filed: Feb. 10, 1995

[51] Int. Cl.$^6$ .................................................. G01R 31/28
[52] U.S. Cl. ......................... 371/22.1; 371/22.3; 371/22.5
[58] Field of Search ................................. 371/22.1, 22.3, 371/22.4, 22.5, 22.6, 24, 15.1

[56] References Cited

U.S. PATENT DOCUMENTS 5,077,738  12/1991  Larsen et al. .

*Primary Examiner*—Vincent P. Canney
*Attorney, Agent, or Firm*—Merchant Gould Smith Edell Welter & Schmidt

[57] ABSTRACT

A circuit for generating test-mode signals for memory which uses both hardware and software protection schemes. The circuit enters a test code by receiving a high voltage at two terminals. The high voltage must remain on at least one of the terminals during the test code process. Otherwise, the circuit is reset. The test code contains test code bits and format code bits. The format code bits are the same for all test codes and distinguish the test codes from commands.

41 Claims, 5 Drawing Sheets

APPARATUS FOR ENTERING AND EXECUTING TEST MODE OPERATIONS FOR MEMORY

FIELD OF THE INVENTION

The present invention relates generally to semiconductor circuits and packaged integrated circuits, such as memory chips, data registers and the like. More particularly, the present invention relates to circuitry for generating test-mode signals.

BACKGROUND OF THE INVENTION

Testing and potentially modifying internal parameters of memory chips for the purpose of circuit optimization is critically important. This is particularly important because memory chips are becoming more complex and the time to market is a very critical factor in the success of any chip. In some chips, this is done by making modifications to masks such as metal or contact. The masks are processed toward the end of the fabrication process and making changes to the circuitry using these masks does not add too much of a time penalty. Although this is a valid solution, it still fails to allow for maximum flexibility or minimize turnaround times.

With memories such as non-volatile memories, more flexibility is added through the use of such memory elements in modifying circuit parameters. By programming a specific pattern in these memory elements, one can change the configuration of the circuitry and even the configuration of the entire chip. The modification of these settings are done through non-user modes of operation and usually during test mode operations. However, accidental modification of any of these settings can have devastating effects on the operation of the chip and must be avoided.

Test modes are non-user modes that are typically used for stressing or changing the internal settings of the parts. The accidental or even intentional use of such modes by a user could damage the part. Some test-mode enable schemes use high voltage signals to execute a test mode. With these approaches, however, a noisy set-up may potentially trigger a test mode. Still other schemes require a complicated software sequencing to achieve the desired test modes. With these test modes, however, software alone might still too easily allow a user to trigger a test mode, which could adversely affect the part.

SUMMARY OF THE INVENTION

Generally, the present invention provides an improved circuit for generating test-mode signals, which may be used, for example, in testing memory chips.

In one particular embodiment, the present invention is implemented in the form of a circuit for generating an enable signal for testing a circuit, comprising: a first voltage detector for detecting a test-activation voltage; a second voltage detector for detecting the test-activation voltage; a first latch for receiving a test signal; and an enable circuit, coupled to the first and second voltage detectors and the latch, for decoding the test signal to determine if the test signal is valid and for generating an enable signal if the test signal is valid and the first and second voltage detectors detect the test-activation voltage.

In another embodiment, the present invention comprises a method of generating an enable signal for testing a circuit, comprising the steps of: detecting an activation voltage; receiving a test signal; decoding the test signal in order to determine if the test signal is valid; and generating an enable signal when the activation voltage is detected if the test signal is valid.

The above summary of the present invention is not intended to present each embodiment or every aspect of the present invention. This is the purpose of the figures and the associated description which follow.

BRIEF DESCRIPTION OF THE DRAWINGS

Other aspects and advantages of the present invention will become apparent upon reading the following detailed description and upon reference to the drawings in which.

Figure 1:
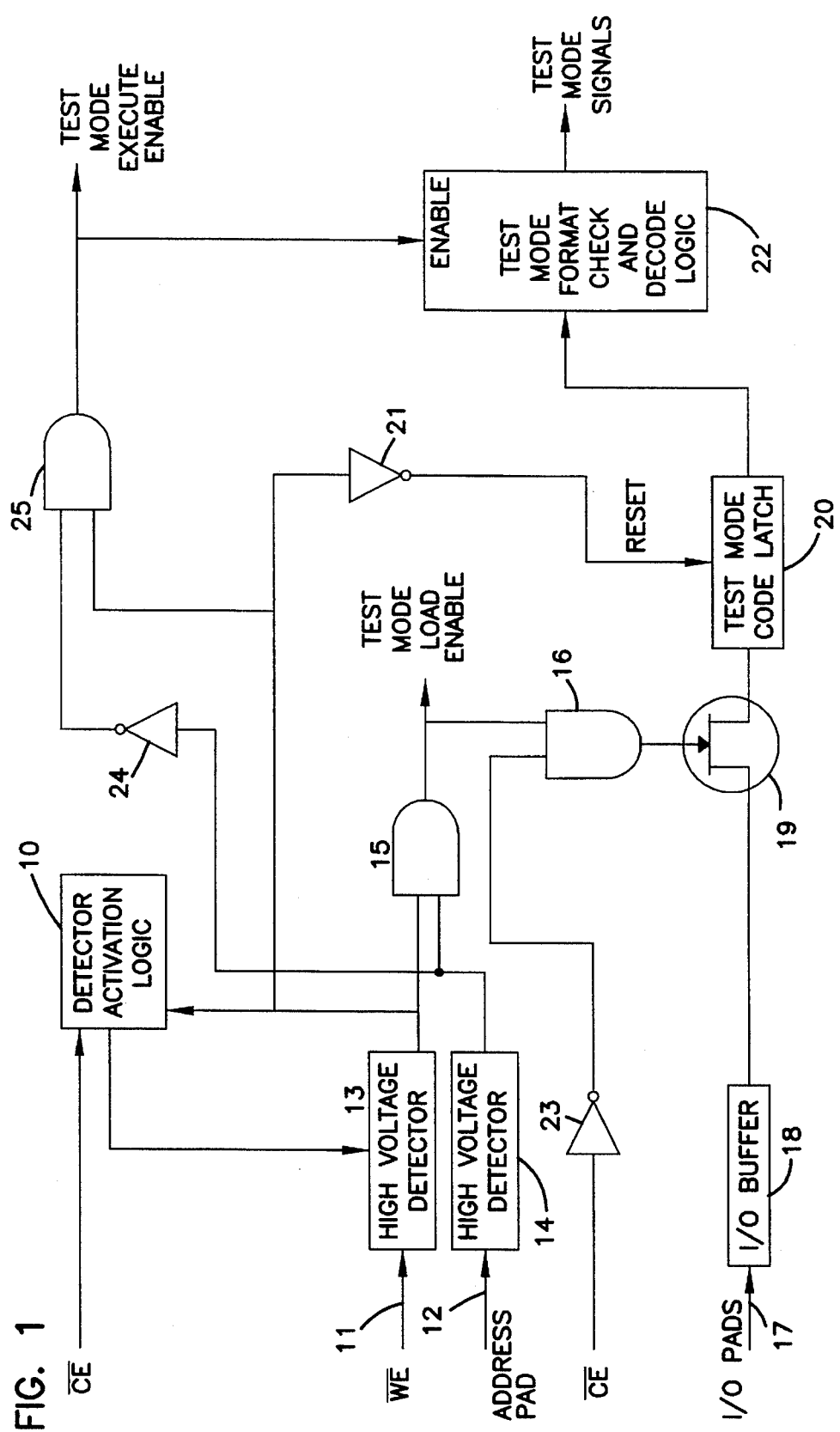
FIG. 1 is a first exemplary test mode circuit in accordance with the principles of the present invention.

While the invention is susceptible to various modifications and alternative forms, specifics thereof have been shown by way of example in the drawings and will be described in detail in the next section. It should be understood, however, that the intention is not to limit the invention to the particular embodiment described. Rather, the intention is to encompass all modifications, equivalents, and alternatives falling within the spirit and scope of the invention as defined by the appended claims.

DETAILED DESCRIPTION OF THE DRAWINGS

The present invention has a wide variety of applications in circuits or parts that use test modes or signals. For example, the present invention may be used for generating test modes or signals for use with EPROMs, flash EPROMs, EEPROMs, DRAMS, and SRAMs.

The present invention provides for a scheme to enter and execute different test modes that minimizes the chances of accidental entry of test modes. It also provides safeguards to ensure that test modes are only activated when specific conditions are present that are not usually available on the normal systems. More particularly, the present invention provides a scheme to enter a test mode that uses both hardware and software protection, preferably maintaining maximum hardware protection during entry and both maximum software and hardware protection during execution.

In order to enter a test mode according to a preferred circuit embodiment of the present invention, the following occurs:

(1) Two or more pins (11, 12) of the circuit are brought up to high voltage;

(2) On the high going edge of $\overline{CE}$, a test mode code on I/O lines is written to a test mode latch in the circuit;

(3) At least one of the pins (11, 12) must remain high during the entire duration of the test mode; otherwise the entire test mode is discontinued and all latches are reset;

(4) Some of the pins in the circuit that were at high voltage must be brought down to normal operating ranges after the test mode code is entered; and (5) The test mode code is compared with decoding logic against predetermined codes and code formats in order for the part to enter the desired mode.

The above procedure is further explained below and is only one example of a procedure for implementing the present invention; other procedures are possible.

FIG. 1 is a schematic diagram of an exemplary circuit for implementing the present invention. The circuit preferably operates as follows for generating test code signals. A high voltage is placed on two or more pins 11 and 12 in order to initiate the test mode. The high voltage is detected by detectors 13 and 14, which may be implemented with known detector circuits. Then, the $\overline{CE}$ signal is brought low and appropriate test mode codes are placed on I/O lines 17 and into buffer 18.

The AND gate 15 ensures that both inputs 11 and 12 have a high voltage in order initiate the test code process. The output of the AND gate 15 and the $\overline{CE}$ signal form the inputs to AND gate 16. Therefore, with both inputs 11 and 12 HIGH, one input to gate 16 will be HIGH. When the other input ($\overline{CE}$) to gate 16 is also HIGH, the output of gate 16 is HIGH and turns on transistor 19, which functions as a switch to transfer the I/O signal from the buffer 18 to a test mode code latch 20. The latch 20 is preferably an eight one-bit latches arranged in parallel. On the high going edge of the $\overline{CE}$ signal, the test mode code is latched into a test mode code latch 20. Since two or more pins 11 and 12 must be at high voltage at the same time during the code entry, this affords the hardware protection during entry of the test code. Therefore, two pins are preferably at a high voltage to load the test mode code and then one of the pins is brought to a low voltage to shut off the loading.

The output of the voltage detector 13 also enables circuit 22, which performs test mode format checking and decoding, as explained below. Circuit 13 operates under a type of hysteresis effect controlled by $\overline{WE}$. Circuit 13 is enabled upon by $\overline{WE}$ obtaining a first predetermined voltage, such as 9.5 volts. Once enabled, circuit 13 remains operational unless $\overline{WE}$ falls below a second predetermined voltage, such as 8 volts. Therefore, when circuit 13 is activated, $\overline{WE}$ may fluctuate slightly without disabling the test mode. If $\overline{WE}$ falls below the second predetermined voltage, latch 20 is reset through the inverter 21, disabling the test mode.

Figure 2:
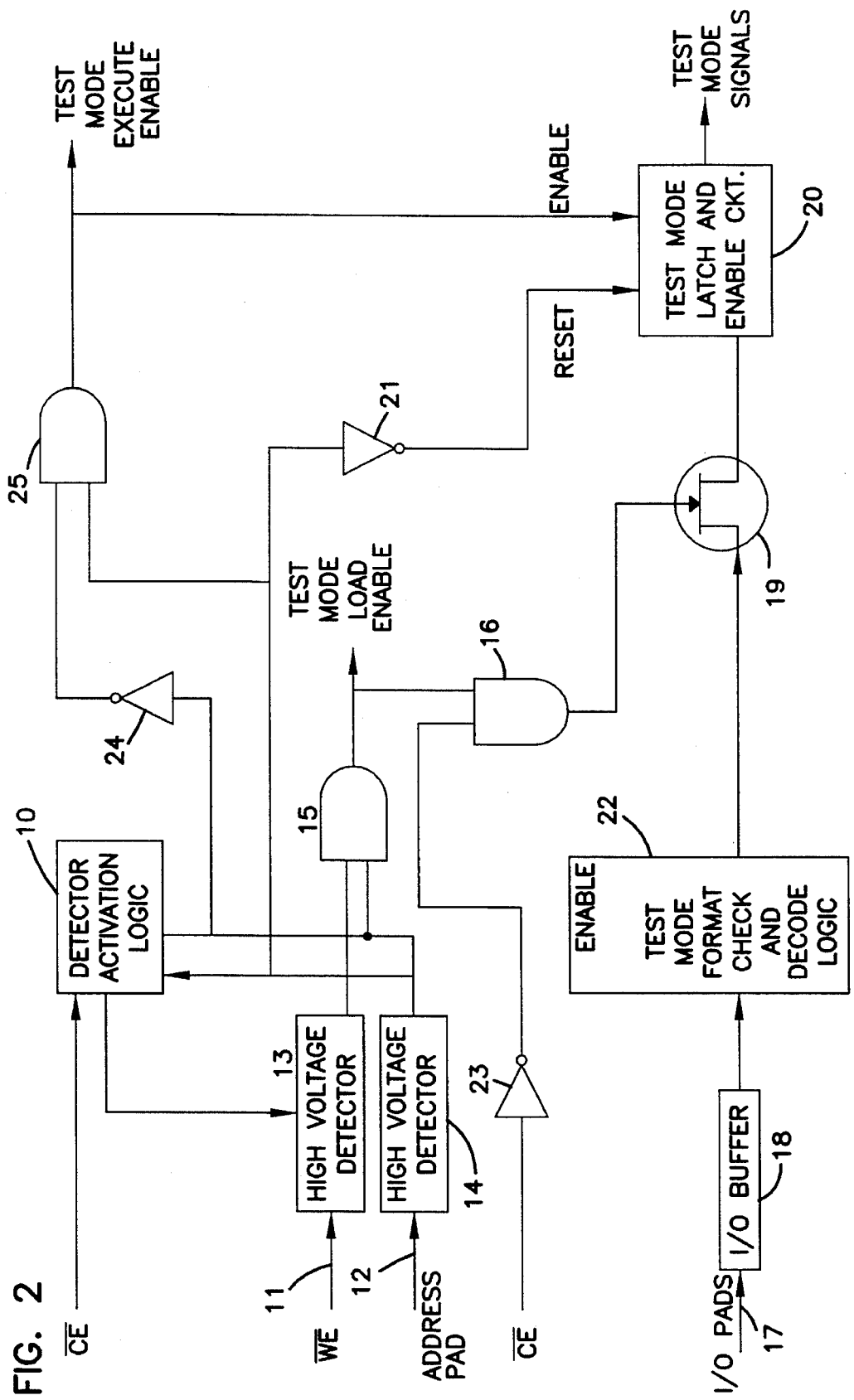
FIG. 2 is a second exemplary test mode circuit in accordance with the principles of the present invention.

FIG. 2 shows an alternate embodiment of the exemplary circuit of FIG. 1. In the circuit of FIG. 2, the locations of the latch 20 and circuit 22 are essentially reversed such that the output of the circuit 22 is transmitted via transistor 19 to the latch 20. Otherwise, the alternate embodiment of FIG. 2 operates in a similar manner as described above with respect to the circuit of FIG. 1.

Figure 3:
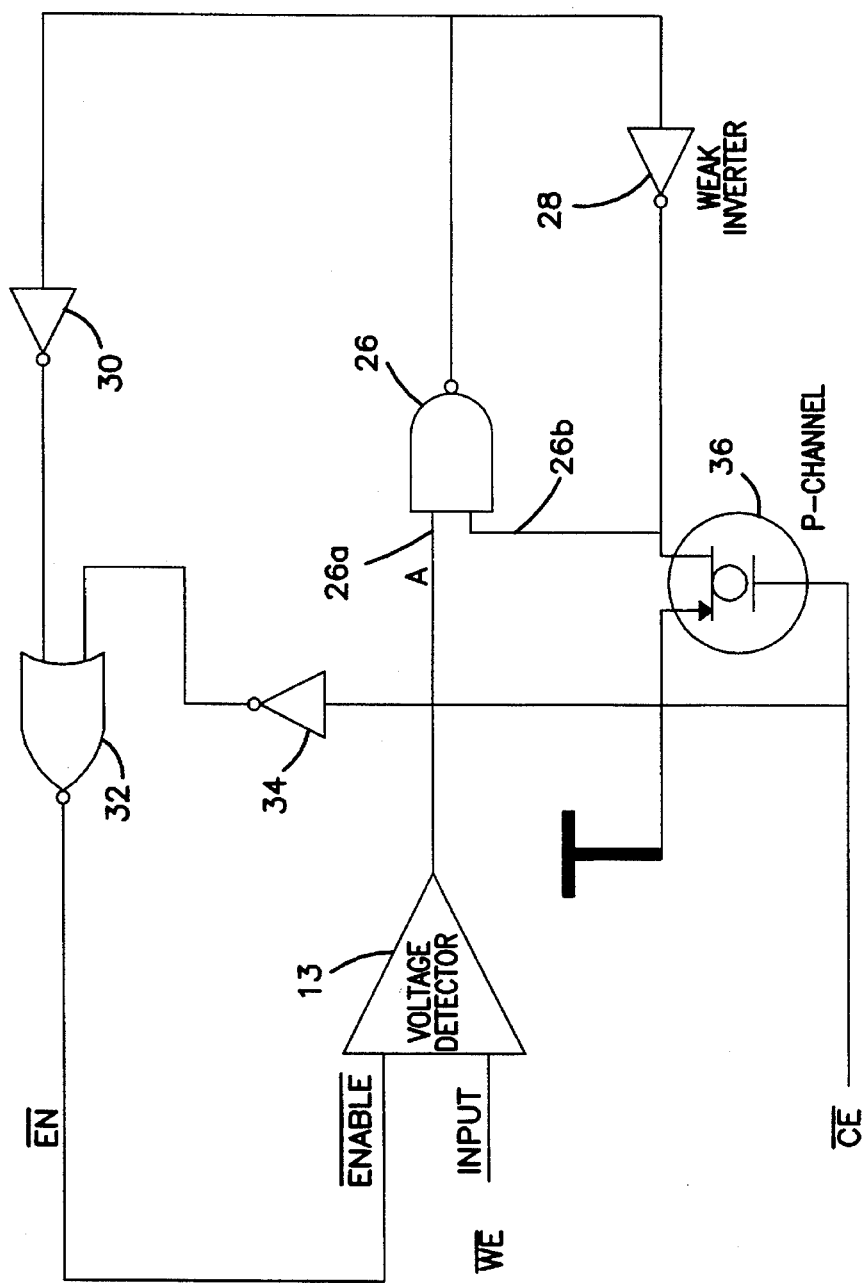
FIG. 3 is an exemplary detector activation logic circuit in accordance with the principles of the present invention.

FIG. 3 is an exemplary high voltage detection circuitry (detector activation logic) for determining whether a pin has higher voltage than a predetermined voltage, such as 9 volts. Since most high voltage detect circuits draw current when enabled, the $\overline{CE}$ signal is typically used to power up the detectors. The $\overline{CE}$ pin toggles to load the test mode codes into the latch 20 and decoding logic 22. However, this also would result in the output of a high voltage detector within the circuit to switch from HIGH to LOW at the high-going edge of $\overline{CE}$ and hence reset the test mode. To prevent this undesired effect, the detector activation logic 10 shown in FIGS. 1 or 2 is used to ensure that once the output of the high voltage detector is asserted during the test mode, $\overline{CE}$ is no longer used to power up the detectors and that the test mode is not reset unless $\overline{WE}$ falls below a predetermined voltage.

The logic circuit 10 is initially activated by the $\overline{CE}$ signal, which turns on transistor 36 and raises the voltage at input 26b. The $\overline{CE}$ signal also enables voltage detector 13 through inverter 34. Once the output of the voltage detector 13 is asserted signifying that $\overline{WE}$ is a high voltage, so that the both inputs to gate 26 are HIGH, a latch is set to keep the high voltage detectors powered up even if $\overline{CE}$ toggles or changes value. The latch is formed by NAND gate 26 and inverter 28. This ensures that if the $\overline{CE}$ signal toggles after setting the latch, the internal test mode execute enable signal remains valid as long as $\overline{WE}$ remains at a high voltage. This latch is reset if the $\overline{WE}$ signal falls below a predetermined voltage. Accordingly, the detector activation logic circuit 10 ensures that if the $\overline{WE}$ pin obtains a high voltage on it due to noise, the circuit will not stay in the test mode unless a DC voltage higher than the predetermined voltage remains on the $\overline{WE}$ pin. This provides the hardware protection during the execution.

The codes are preferably of a specific format, therefore reducing the possibility of mistakenly entering test modes. The codes and their format are preferably sufficiently different than regular commands used to issue activities in the chip. The test mode code is typically divided into two groups of bits. The first is a set of bits that have the same value for a set of different test codes. This section of the code is referred to as the format.

The other bits in the code are used to decode the different test modes, This feature not only makes it safer to keep the test mode codes different from the regular commands, it reduces the circuitry needed to decode the different test modes. By having only one detector for the format bits, that portion of the code requires only one decoder, as opposed to one for each code. For example, if the circuit requires that bits 0–3 of the code be the Hexadecimal value "A", only one four-bit decoder is required to identify the format. Other four-bit decoders are needed for bits 4–7. The output of those decoders is "ANDed" with the output of the single format decoder.

Figure 4:
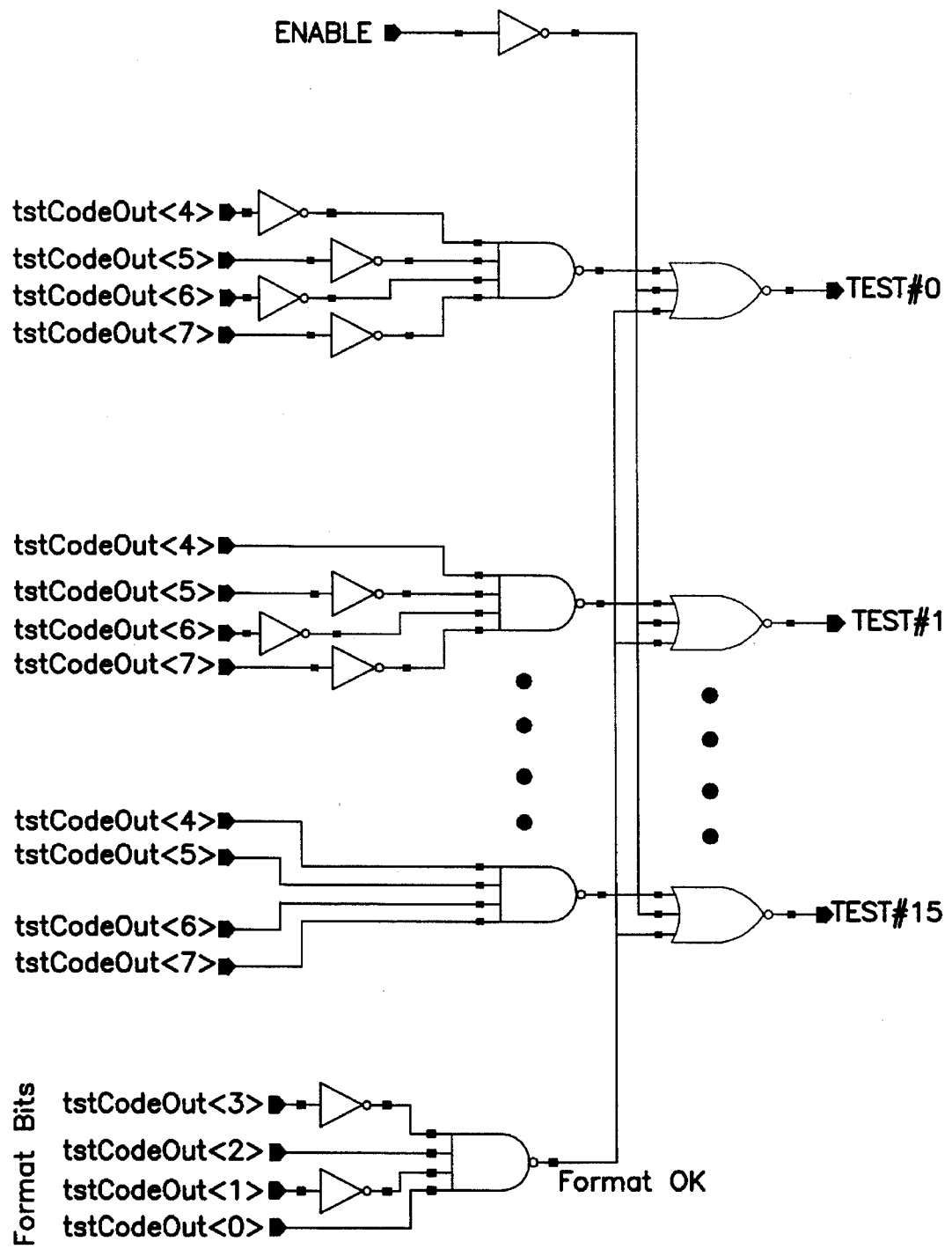
FIG. 4 is an exemplary circuit for test mode format checking and decoding in according with the principles of the present invention.

FIG. 4 is an exemplary circuit for test mode format checking and decoding performed by the circuit 22 which performs the decoding of the test code signals.

Figure 5:
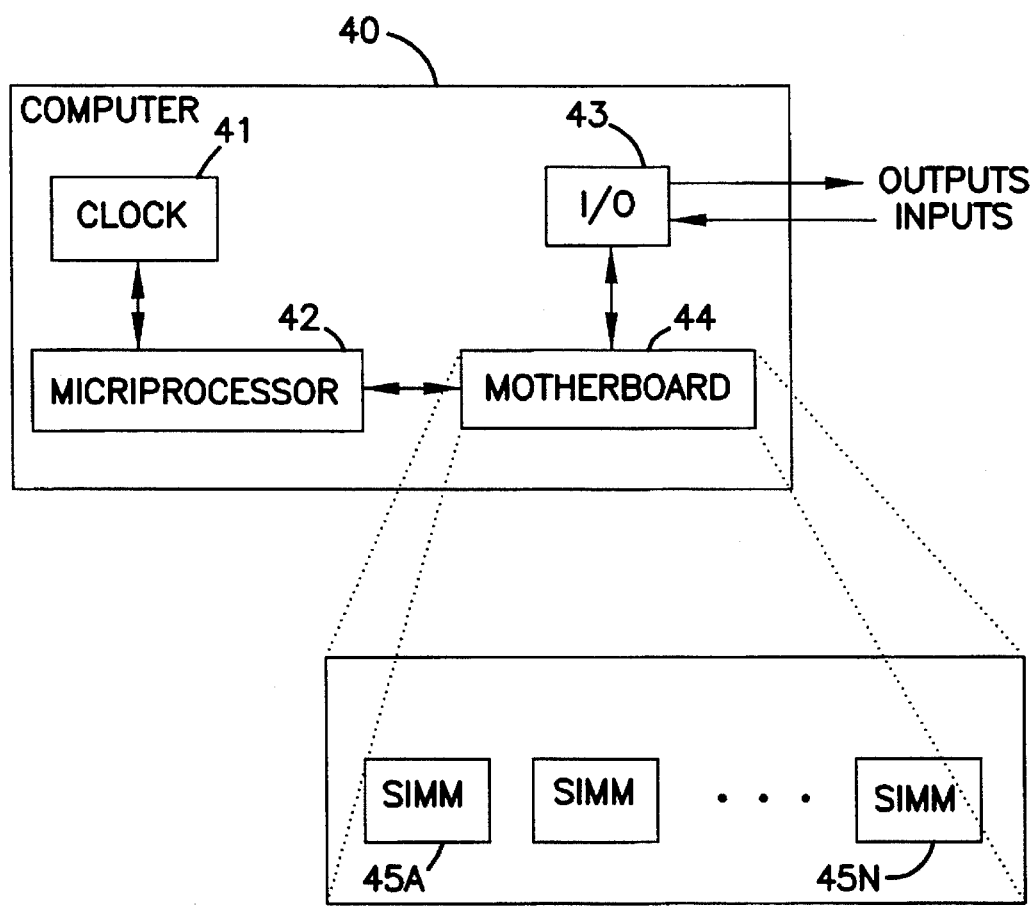
FIG. 5 is a block diagram of an exemplary computer with a memory for use with the present invention.

FIG. 5 is a block diagram of a computer 40 that includes a memory which may be used with the present invention. The computer 40 includes a microprocessor 42 and corresponding clock 41. The microprocessor 42 contains the central processing unit (CPU) and associated control circuitry. The microprocessor 42 is connected to a motherboard 44. An I/O interface module 43 is connected to the motherboard 44 and interfaces the microprocessor 42 with peripheral devices such as a monitor and printer. The motherboard 44 also contains a plurality of memory modules for storing data, such as single in-line memory modules (SIMMs) 45A–45N. The motherboard 44 is typically implemented with a printed circuit board, and the SIMMs 45A–45N are typically implemented with integrated circuit packages which "plug into" the motherboard 44. The circuit shown in FIG. 1 may also implemented in an integrated circuit package within the computer 40. A nonvolatile memory is usually used on the motherboard 44, SIMMs 45A–45N, or through the I/O interface module 43.

The foregoing description, which has been disclosed by way of the above examples and discussion, addresses preferred embodiments of the present invention encompassing the principles of the present invention. The embodiments may be changed, modified and/or implemented using various circuit types and arrangements. For example, different circuit components can be used without departing from the scope of the invention. Those skilled in the art will readily recognize that these and various other modifications and changes may be made to the present invention without strictly following the exemplary embodiments and applications illustrated and described herein, without departing from the true spirit and scope of the present invention which is set forth in the following claims.

What is claimed is:

1. A circuit for generating an enable signal for testing a circuit, comprising:

a first voltage detector for detecting a test-activation voltage;

a second voltage detector for detecting the test-activation voltage;

a first latch for receiving a test signal; and an enable circuit, coupled to the first and second voltage detectors and the latch. for decoding the test signal to determine if the test signal is valid and for generating an enable signal if the test signal is valid and the first and second voltage detectors detect the test-activation voltage.

2. The circuit of claim 1 wherein the enable circuit generates the enable signal if both the first and second voltage detectors detect a high voltage and either the first or second voltage detector subsequently detects a low voltage.

3. The circuit of claim 1 wherein the enable circuit is enabled upon receiving a voltage above a first predetermined value and the enable circuit is reset if the voltage decreases below a second predetermined value.

4. The circuit of claim 1 wherein the enable circuit decodes the test signal by comparing the test signal with a predetermined value in order to determine if the test signal and the predetermined value match.

5. The circuit of claim 1 wherein the enable circuit resets the enable signal if the test-activation voltage does not remain at the first voltage detector.

6. The circuit of claim 5, further comprising a detector circuit for detecting if the test-activation voltage does not remain at the voltage detector.

7. The circuit of claim 6, wherein the detector circuit comprises:

a second latch coupled to the output of the first voltage detector and to the enable circuit, the second latch maintaining power to the first voltage detector; and a circuit coupled to the second latch for resetting the second latch.

8. The circuit of claim 1 wherein the test signal comprises format bits and test code bits.

9. The circuit of claim 1 wherein the enable circuit generates the enable signal for testing a flash EPROM.

10. The circuit of claim 1 wherein the enable circuit generates the enable signal for testing an SRAM.

11. The circuit of claim 1 wherein the enable circuit generates the enable signal for testing an EEPROM.

12. The circuit of claim 1 wherein the enable circuit generates the enable signal for testing a DRAM.

13. The circuit of claim 1 wherein the enable circuit is connected to an input to the first latch.

14. The circuit of claim 1 wherein the enable circuit is connected to an output of the first latch.

15. The circuit of claim 1 wherein the circuit is contained within an integrated circuit package.

16. A method for generating an enable signal for testing a circuit, comprising the steps of:

detecting an activation voltage by detecting a high voltage with a first voltage detector and a second voltage detector and subsequently detecting a low voltage with the first voltage detector or the second voltage detector;

receiving a test signal;

decoding the test signal to determine if the test signal is valid; and generating an enable signal when the activation voltage is detected if the test signal is valid, and when the high voltage is detected with both the first and second voltage detectors and when the low voltage is subsequently detected with either the first or second voltage detector.

17. The method of claim 16 wherein:

the detecting step comprises the steps of detecting a high voltage with both a first voltage detector and a second voltage detector and subsequently detecting a low voltage with either the first or second voltage detector; and the generating step comprises the step of generating the enable signal when the high voltage is detected with both the first and second voltage detectors and the low voltage is subsequently detected with either the first or second voltage detector.

18. The method of claim 16 wherein the generating step generates the enable signal upon receiving a voltage above a first predetermined value and resets the enable signal if the voltage decreases below a second predetermined value.

19. The method of claim 16 wherein the decoding step further comprises the step of comparing the test signal with a predetermined value to determine if the test signal and the predetermined value match.

20. The method of claim 16 wherein the generating step further comprises the step of resetting the enable signal if the test-activation voltage is not continuously detected during the decoding step.

21. The method of claim 16 wherein the detecting step further comprises the steps of:

setting a latch upon detecting the test-activation voltage, the setting of the latch maintaining power to a voltage detector for detecting the activation voltage; and resetting the latch if the test-activation voltage decreases to a value less than a predetermined value.

22. The method of claim 16 wherein the generating step generates the enable signal for testing a flash EPROM.

23. The circuit of claim 16 wherein the generating step generates the enable signal for testing an SRAM.

24. The circuit of claim 16 wherein the generating step generates the enable signal for testing an EEPROM.

25. The circuit of claim 16 wherein the generating step generates the enable signal for testing a DRAM.

26. A computer with a circuit for generating an enable signal for testing a circuit, comprising:

a processor;

a clock circuit connected to the processor;

a module, connected to the processor, for interfacing the processor with peripheral devices; and a memory module connected to the processor, comprising: a circuit for generating an enable signal for testing the memory module, comprising:

a first voltage detector for detecting a test-activation voltage;

a second voltage detector for detecting the test-activation voltage;

a first latch for receiving a test signal; and an enable circuit, coupled to the first and second voltage detectors and the latch, for decoding the test signal to determine if the test signal is valid and for generating an enable signal if the test signal is valid and the first and second voltage detectors detect the test-activation voltage.

27. The computer of claim 26 wherein the enable circuit generates the enable signal if both the first and second voltage detectors detect a high voltage and either the first or second voltage detector subsequently detects a low voltage.

28. The computer of claim 26 wherein the enable circuit is enabled upon receiving a voltage above a first predetermined value and the enable circuit is reset if the voltage decreases below a second predetermined value.

29. The computer of claim 26 wherein the enable circuit decodes the test signal by comparing the test signal with a predetermined value in order to determine if the test signal and the predetermined value match.

30. The computer of claim 26 wherein the enable circuit resets the enable signal if the test-activation voltage does not remain at the first voltage detector.

31. The computer of claim 30, further comprising a detector circuit for detecting if the test-activation voltage does not remain at the voltage detector.

32. The computer of claim 31, wherein the detector circuit comprises:
    a second latch coupled to the output of the first voltage detector and to the enable circuit, the second latch maintaining power to the first voltage detector; and
    a circuit coupled to the second latch for resetting the second latch.

33. The computer of claim 26 wherein the test signal comprises format bits and test code bits.

34. The computer of claim 26 wherein the enable circuit generates the enable signal for testing a flash EPROM.

35. The computer of claim 26 wherein the enable circuit Generates the enable signal for testing an SRAM.

36. The computer of claim 26 wherein the enable circuit generates the enable signal for testing an EEPROM.

37. The computer of claim 26 wherein the enable circuit generates the enable signal for testing a DRAM.

38. The computer of claim 26 wherein the enable circuit is connected to an input to the first latch.

39. The computer of claim 26 wherein the enable circuit is connected to an output of the first latch.

40. The computer of claim 26 wherein the circuit is contained within an integrated circuit package.

41. A method for generating an enable signal for testing a circuit, comprising the steps of:
    detecting an activation voltage by detecting a high voltage with a first voltage detector and a second voltage detector and subsequently detecting a low voltage with the first voltage detector or the second voltage detector;
    receiving a test signal;
    decoding the test signal to determine if the test signal is valid; and
    generating an enable signal when the activation voltage is detected if the test signal is valid.

* * * * *